United States Patent
Choi et al.

(10) Patent No.: US 7,741,145 B2
(45) Date of Patent: Jun. 22, 2010

(54) HIGHLY EFFICIENT ORGANIC LIGHT-EMITTING DEVICE USING SUBSTRATE OR ELECTRODE HAVING NANOSIZED HALF-SPHERICAL CONVEX AND METHOD FOR PREPARING THE SAME

(75) Inventors: Hyeon Choi, Daejeon Metropolitan (KR); Sea Hwan Son, Daejeon Metropolitan (KR)

(73) Assignee: LG Chem. Ltd., Seoul (KR)

( * ) Notice: Subject to any disclaimer, the term of this patent is extended or adjusted under 35 U.S.C. 154(b) by 0 days.

(21) Appl. No.: 12/213,015

(22) Filed: Jun. 12, 2008

(65) Prior Publication Data

US 2009/0068915 A1    Mar. 12, 2009

Related U.S. Application Data

(62) Division of application No. 11/078,624, filed on Mar. 14, 2005, now Pat. No. 7,414,263.

(30) Foreign Application Priority Data

Mar. 16, 2004    (KR) .......................... 2004-0017710

(51) Int. Cl.
    *H01L 21/00*    (2006.01)
(52) U.S. Cl. .................... 438/82; 438/99; 257/E51.022
(58) Field of Classification Search .................. 438/29, 438/30, 48, 82, FOR. 231, 99; 257/E51.022
    See application file for complete search history.

(56) References Cited

U.S. PATENT DOCUMENTS

| | | | |
|---|---|---|---|
| 6,630,684 B2 | 10/2003 | Lee et al. | |
| 7,173,276 B2 * | 2/2007 | Choi et al. | ..................... 257/40 |
| 2001/0033347 A1 | 10/2001 | Kitahora et al. | |
| 2002/0118271 A1 * | 8/2002 | Mashimo et al. | ............ 347/241 |
| 2003/0020399 A1 | 1/2003 | Moller et al. | |
| 2003/0122480 A1 | 7/2003 | Wei et al. | |

(Continued)

FOREIGN PATENT DOCUMENTS

JP    09-050031    2/1997

(Continued)

OTHER PUBLICATIONS

Applied Physics Letters "A high-extraction-efficiency nanopatterned organic light-emitting diode"; vol. 82, No. 21.

(Continued)

*Primary Examiner*—Brook Kebede
(74) *Attorney, Agent, or Firm*—McKenna Long & Aldridge LLP

(57) ABSTRACT

The present invention provides a transparent substance formed with a plurality of continuous half-spherical convexes having a diameter of 25~1,000 nm on its first main surface; an organic light-emitting device comprising a substrate, a first electrode, an organic material layer(s) and a second electrode, sequentially, characterized by having a plurality of continuous half-spherical convexes having a diameter of 25~1,000 nm on the underside of the substrate that does not contact the first electrode and/or the upside of the second electrode that does not contact the organic material layer; and a method for preparing same using a porous aluminum oxide layer forming process.

3 Claims, 2 Drawing Sheets

U.S. PATENT DOCUMENTS

| 2004/0017153 A1 | 1/2004 | Nishikawa |
| 2005/0274145 A1 | 12/2005 | Aitken et al. |

FOREIGN PATENT DOCUMENTS

| JP | 2000-182016 | 6/2000 |
| JP | 2000-323272 | 11/2000 |
| JP | 2002-182016 | 6/2002 |
| JP | 2003-216100 | 7/2003 |
| JP | 2004-031221 | 1/2004 |
| KR | 10-2003-0026450 | 9/2001 |
| KR | 10-2004-0019186 | 3/2004 |
| WO | WO 00/70691 A1 | 11/2000 |
| WO | WO 01/33598 A1 | 5/2001 |
| WO | WO 02/080626 A1 | 10/2002 |
| WO | WO 02/090626 A1 | 11/2002 |
| WO | WO 2003/007663 A1 | 1/2003 |
| WO | WO 03/012890 A2 | 2/2003 |

OTHER PUBLICATIONS

Journal of Applied Physics Improved light out-coupling in organic light emitting diodes employing ordered microlens arrays; vol. 91 No. 5.

Journal of Applied Physics Hexagonal pore arrays with 50-420 nm interpore distance formed by self-organization in anodic alumina; vol. 84, No. 11.

Alexander V. Kukhta et al., "Porous Alumina Based Cathode for Organic Light-Emitting Devices," Institute of Molecular and Atomic Physics of the National Academy of Sciences of Belarus, SPIE vol. 4105 (2001), pp. 405-412.

* cited by examiner

US 7,741,145 B2

HIGHLY EFFICIENT ORGANIC LIGHT-EMITTING DEVICE USING SUBSTRATE OR ELECTRODE HAVING NANOSIZED HALF-SPHERICAL CONVEX AND METHOD FOR PREPARING THE SAME

This application is a Divisional of application Ser. No. 11/078,624 filed Mar. 14, 2005 now U.S. Pat. No. 7,414,263, which is hereby incorporated by reference as if fully set forth herein. This application claims the benefit of the Korean Patent Application No. 2004-0017710, filed Mar. 16, 2004 which is hereby incorporated by reference as if fully set forth herein.

TECHNICAL FIELD

The present invention relates to an organic light-emitting device, particularly an organic light-emitting device having non-planar structure, and a method for preparing the same. More particularly, the present invention relates to a transparent substance having continuous nano-sized half-spherical convexes, a highly efficient organic light-emitting device using the same, and a method for preparing the same.

BACKGROUND ART

Organic electroluminescence means converts electrical energy into light energy by using organic materials. Its principle is explained as follows. When voltage is applied between an anode and a cathode while aligning an organic material layer between the anode and the cathode, holes are injected into the organic material layer from the anode, and electrons are injected into the organic material layer from the cathode. When the injected holes couple with the injected electrons, excitons may be formed and such excitons fall to the ground state to generate light. Such generated light is emitted through an anode, a cathode or both electrodes. Generally, an organic light-emitting device may be classified as a top emission type, bottom emission type and bilateral emission type according to the emitting direction of light.

Recently, research has been actively carried out for preparing displays or illumination units by using such electroluminescent phenomenon. In addition, techniques for depositing organic material layers in the form of a single layer to multi-layers are being actively studied in order to achieve effective organic light-emitting devices. Most currently available organic light-emitting devices include electrode layers and organic material layers deposited in the form of a planar structure. An organic light-emitting device having a planar multi-layer structure comprising electrode layers, and organic material multi-layers including a hole injection layer (103), a hole transport layer (104), a light-emitting layer (105), and an electron transport layer (106) as shown in FIG. 1, has been widely used.

The light generated from a light-emitting layer of the organic light-emitting device in FIG. 1 may pass through two different paths. Namely, the light may be emitted out of the organic light-emitting device through a transparent anode layer and glass substrate or may remain in the organic light-emitting device by being reflected entirely from the glass substrate surface or the anode surface. At this time, the amount of the light emitted out of the organic light-emitting device is only about $1/2n^2$ among the light generated from the light-emitting layer (wherein, n is the refractive index of an organic material layer). If the refractive index of the organic material layer is 1.7, less than 17% of the light generated from the device can be emitted out of the organic light-emitting device.

To solve the above problem and emit a large amount of light out of the organic light-emitting device, an organic light-emitting device including a non-planar layer, i.e., non-planar structure, has been suggested. The organic light-emitting device having a non-planar structure can be prepared through the following two methods.

According to a first method, a photonic crystal having a gravure pattern is formed on a glass substrate through a photolithography process before a transparent anode is deposited on the glass substrate (see U.S. Pat. No. 6,630,684 and Appl. Phys. Lett. 82, 3779 issued in 2003 by Y. Lee et al.), or a corrugated pattern is formed on the glass substrate by using an interference of light (see WO 2000/70691 and Adv. Mater. 13, 123 issued in 2001 by B. J. Matterson et al.), for improving light-emitting efficiency. In detail, the former deposits an anode layer on the glass substrate, after forming the photonic crystal on the glass substrate and flattening the surface thereon by using $SiN_x$. The latter deposits an electrode layer and an organic material layer on the glass substrate while maintaining a corrugated pattern, after forming the corrugated pattern of transparent polymer on the glass substrate by using photoresist materials and an interference of light.

According to a second method, after preparing an organic light-emitting device having a planar structure as shown in FIG. 1, a micro-sized lens structure (see WO 2003/007663 and J. Appl. Phys. 91, 3324 issued in 2002 by S. Moller et al.) or a millimeter-sized lens structure (see WO 2001/33598) is attached to a surface of a glass substrate of the organic light-emitting device, thereby improving the light-emitting efficiency of the device.

The above two methods can improve the light-emitting efficiency of the light-emitting device. However, the above two methods cause problems when they are applied to an available product.

The first method uses the photolithography process, so it may be impossible to economically form the photonic crystal structure or the corrugated structure over a large-sized area. That is, in order to prepare the light-emitting device using the photonic crystal structure, it is necessary to sequentially carry out a deposition process, a photolithography process, and an etching process. At this time, the substrate must be processed at least two times under a vacuum state. In addition, in order to prepare the light emitting device using the corrugated structure, it is necessary to perform the photolithography process by using an interference of light. However, the photolithography process is not adaptable for forming a uniform corrugated structure over a substrate having an area more than a few $cm^2$.

The second method has limitations when it is applied to a display because the lens structure has a size in the range of about a few micrometers to a few millimeters. In addition, the second method is not adaptable for a large-sized area due to preparation work thereof. According to the lens structure disclosed in WO 2003/007663, a minimum surface size of the lens structure is defined as a few μm such that the minimum surface size of the lens structure must be larger than the maximum wavelength of visible ray emitted from the organic light-emitting device. In addition, according to the lens structure disclosed in WO 2001/33598, the size of the lens structure must be larger than the size of one unit of an organic light-emitting device.

DISCLOSURE OF THE INVENTION

The inventors of the present invention have found that when an aluminum substrate having continuous nano-sized half-spherical recesses formed by a porous aluminum oxide layer forming process was used as a mold, continuous nano-sized half-spherical convexes can be economically formed on a large-sized transparent substance. In addition, the inventors have found that continuous nano-sized half-spherical convexes can be formed on an organic light-emitting device by using the transparent substance prepared by such method, and thus the light generated in an organic material layer of the organic light-emitting device can be maximally emitted out of the device.

Accordingly, it is an object of the present invention to provide a transparent substance having continuous nano-sized half-spherical convexes on its first main surface, an organic light-emitting device having continuous nano-sized half-spherical convexes prepared by adhering the above transparent substance to a substrate and/or an electrode of the device, and methods for preparing them.

One aspect of the present invention provides a transparent substance wherein a plurality of continuous half-spherical convexes having a diameter of 25-1,000 nm are formed on a first main surface of the transparent substance.

Another aspect of the present invention provides a transparent substance, wherein a plurality of continuous half-spherical convexes having a diameter of 25-1,000 nm are formed on a first main surface of the transparent substance, prepared by a method comprising the steps of:

a) dipping an aluminum substrate having at least one aluminum surface in an acid solution, and applying an oxidation voltage of 10-400 V to the aluminum substrate so as to form an aluminum oxide layer on one surface of the aluminum substrate, in such a manner that a plurality of continuous recesses are formed on the aluminum oxide layer, and a plurality of continuous recesses having a curvature in identical direction to that of the recesses on the aluminum oxide layer are formed on an interface between the aluminum oxide layer and the aluminum substrate;

b) removing the aluminum oxide layer from the aluminum substrate formed with the aluminum oxide layer thereon, thereby forming a plurality of continuous half-spherical recesses having a diameter of 25-1,000 nm on one surface of the aluminum substrate; and c) forming a plurality of continuous half-spherical convexes, having a diameter of 25-1,000 nm, on the first main surface of a transparent substance by using the aluminum substrate formed with a plurality of continuous half-spherical recesses as a mold.

Another aspect of the present invention provides an organic light-emitting device comprising a substrate, a first electrode, an organic material layer(s) and a second electrode in the sequentially laminated form, wherein a plurality of continuous half-spherical convexes having a diameter of 25-1,000 nm are formed on the underside of the substrate that does not contact the first electrode, the upside of the second electrode that does not contact the organic material layer, or both of them.

Another aspect of the present invention provides a method for preparing a transparent substance, wherein a plurality of continuous half-spherical convexes having a diameter of 25-1,000 nm are formed on a first main surface of the transparent substance, comprising the steps of:

a) dipping an aluminum substrate having at least one aluminum surface in an acid solution, and applying an oxidation voltage of 10-400 V to the aluminum substrate so as to form an aluminum oxide layer on one surface of the aluminum substrate, in such a manner that a plurality of continuous recesses are formed on the aluminum oxide layer, and a plurality of continuous recesses having a curvature in identical direction to that of the recesses on the aluminum oxide layer are formed on an interface between the aluminum oxide layer and the aluminum substrate;

b) removing the aluminum oxide layer from the aluminum substrate formed with the aluminum oxide layer thereon, thereby forming a plurality of continuous half-spherical recesses having a diameter of 25-1,000 nm on one surface of the aluminum substrate; and c) forming a plurality of continuous half-spherical convexes, having a diameter of 25-1,000 nm, on the first main surface of a transparent substance by using the aluminum substrate formed with a plurality of continuous half-spherical recesses as a mold.

Another aspect of the present invention provides a method for preparing an organic light-emitting device, comprising the steps of:

a) preparing an organic light-emitting device by forming a first electrode, an organic material layer(s) and a second electrode on a substrate;

b) adhering a transparent substance to the underside of the substrate that does not contact the first electrode, the upside of the second electrode that does not contact the organic material layer, or both of them in the organic light-emitting device;

c) before or after the b) step, forming a plurality of continuous half-spherical convexes, having a diameter of 25-1,000 nm, on the first main surface of the transparent substance by a method comprising the steps of:

i) dipping an aluminum substrate having at least one aluminum surface in an acid solution, and applying an oxidation voltage of 10-400 V to the aluminum substrate so as to form an aluminum oxide layer on one surface of the aluminum substrate, in such a manner that a plurality of continuous recesses are formed on the aluminum oxide layer, and a plurality of continuous recesses having a curvature in identical direction to that of the recesses on the aluminum oxide layer are formed on an interface between the aluminum oxide layer and the aluminum substrate;

ii) removing the aluminum oxide layer from the aluminum substrate formed with the aluminum oxide layer thereon, thereby forming a plurality of continuous half-spherical recesses having a diameter of 25-1,000 nm on one surface of the aluminum substrate; and iii) forming a plurality of continuous half-spherical convexes, having a diameter of 25-1,000 nm, on the first main surface of a transparent substance by using the aluminum substrate formed with a plurality of continuous half-spherical recesses as a mold.

Another aspect of the present invention provides a method for preparing an organic light-emitting device, comprising the steps of:

a) adhering a transparent substance to a substrate;

b) before or after the a) step, forming a plurality of continuous half-spherical convexes, having a diameter of 25-1,000 nm, on the first main surface of the transparent substance by a method comprising the steps of:

i) dipping an aluminum substrate having at least one aluminum surface in an acid solution, and applying an oxidation voltage of 10-400 V to the aluminum substrate so as to form an aluminum oxide layer on one surface of the aluminum substrate, in such a manner that a plurality of continuous recesses are formed on the aluminum oxide layer, and a plurality of continuous recesses having a curvature in identical direction to that of the recesses on the aluminum oxide layer are formed on an interface between the aluminum oxide layer and the aluminum substrate;

ii) removing the aluminum oxide layer from the aluminum substrate formed with the aluminum oxide layer thereon, thereby forming a plurality of continuous half-spherical recesses having a diameter of 25-1,000 nm on one surface of the aluminum substrate; and iii) forming a plurality of continuous half-spherical convexes, having a diameter of 25-1,000 nm, on the first main surface of a transparent substance by using the aluminum substrate formed with a plurality of continuous half-spherical recesses as a mold;

c) preparing an organic light-emitting device by forming a first electrode, an organic material layer(s) and a second electrode on the upside of the substrate opposite to the side adhering the transparent substance having continuous half-spherical convexes; and optionally d) adhering a transparent substance to the upside of the second electrode that does not contact the organic material layer in the organic light-emitting device; and e) before or after the d) step, forming a plurality of continuous half-spherical convexes, having a diameter of 25-1,000 nm, on the first main surface of the transparent substance on the upside of the second electrode, by a method comprising the steps of:

i) dipping an aluminum substrate having at least one aluminum surface in an acid solution, and applying an oxidation voltage of 10-400 V to the aluminum substrate so as to form an aluminum oxide layer on one surface of the aluminum substrate, in such a manner that a plurality of continuous recesses are formed on the aluminum oxide layer, and a plurality of continuous recesses having a curvature in identical direction to that of the recesses on the aluminum oxide layer are formed on an interface between the aluminum oxide layer and the aluminum substrate;

ii) removing the aluminum oxide layer from the aluminum substrate formed with the aluminum oxide layer thereon, thereby forming a plurality of continuous half-spherical recesses having a diameter of 25-1,000 nm on one surface of the aluminum substrate; and iii) forming a plurality of continuous half-spherical convexes, having a diameter of 25-1,000 nm, on the first main surface of a transparent substance by using the aluminum substrate formed with a plurality of continuous half-spherical recesses as a mold.

BRIEF DESCRIPTION OF THE DRAWINGS

The foregoing and other objects, features and advantages of the present invention will become more apparent from the following detailed description when taken in conjunction with the accompanying drawings in which.

BEST MODE FOR CARRYING OUT THE INVENTION

Hereinafter, the present invention will be described in more detail.

The term "nano-size" generally means the range of 1-1,000 nm in nanometer unit. However, in this specification, the term "nano-size" can be understood to mean 25-1,000 nm of the range of the diameter of the recesses or convexes that can be formed actually on an aluminum substrate or a transparent substance by the present invention.

In addition, the term "a first main surface of a transparent substance" in this specification means a surface formed with convexes by using an aluminum substrate as a mold and opposite to a surface adhering device.

A transparent substance formed with continuous nano-sized convexes on its first main surface according to the present invention has a new structure that can be prepared only by the method of the present invention as described below. The transparent substance can be used as an application for minimizing the condition of a total internal reflection in order to emit more light out of devices in a flat panel display technical field. For example, when the transparent substance according to the present invention is applied to an organic light-emitting device, its principle is provided below.

In an organic light-emitting device comprising a substrate, a first electrode, an organic material layer(s) and a second electrode in sequentially laminated form, the transparent substance formed with continuous nano-sized half-spherical convexes on its first main surface according to the present invention can be disposed on the underside of the substrate that does not contact the first electrode and/or the upside of the second electrode that does not contact the organic material layer. Here, it should be noted that the half-spherical convexes according to the present invention are preferably disposed, not on the interior surface where the device is formed, but on the exterior of the device, i.e., the underside of the substrate and/or the upside of the second electrode. Since an organic light-emitting device must be formed with a very thin thickness, in contrast to other light-emitting devices such as an inorganic electroluminescent device, formation of a non-planar structure in the interior of the device can affect the operation of the device.

Figure 4:
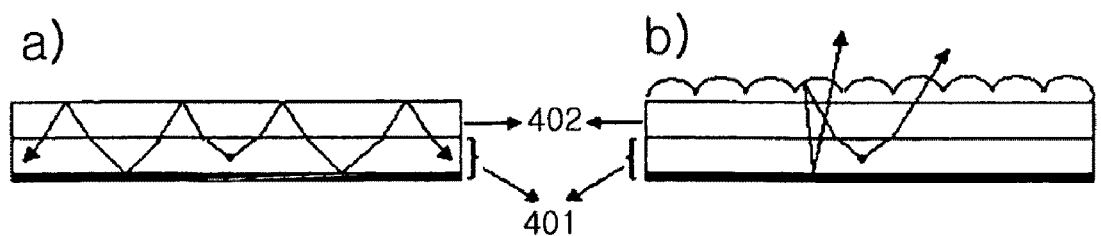
FIG. 4 shows a light route in an organic light-emitting device having a planar transparent substrate and in an organic light-emitting device having a transparent substrate adhering a transparent substance having continuous nano-sized half-spherical convexes (401: organic light-emitting device, 402: transparent substrate).

As illustrated in FIG. 4, in an organic light-emitting device having a surface of a planar structure, the light generated may remain within the organic light-emitting device by a total internal reflection. However, in an organic light-emitting device having continuous nano-sized convexes in its surface, the light may be emitted out of the device by multiple reflections, preferably one or two times on the transparent substance. As shown in the principle above, an organic light-emitting device having a surface formed with continuous nano-sized convexes according to the present invention can emit more light out of the device.

In addition, since half-spherical convexes formed on the surface of an organic light-emitting device according to the present invention are nano-sized and have a similar size to a wavelength of light, they can provide far superior effects than a simple lens by an interaction with the light emitted from the organic material layer. Accordingly, nano-sized half-spherical convexes of the present invention are different from the micro-sized lens structure described in the prior art (WO 2003/7663). A further detailed explanation is provided below.

In the present invention, since half-spherical convexes on the substrate or electrode of the organic light-emitting device are nano-sized, the brightness of the organic light-emitting device can be further improved due to a wave character of light when light is emitted from the organic material layer of the device. For instance, when a diameter of the half-spherical convexes is identical to or shorter than a wavelength of a visible ray, the half-spherical convex structure may convert the route of light by a diffused reflection or a scattering phenomenon of light. Therefore, the half-spherical convexes can cause more light to be emitted out of the organic light-emitting device by minimizing a total internal reflection condition more than the planar structure. Such effect may be increased when the diameter of the half-spherical convexes is set within a range between a half-wavelength and one wavelength of the visible ray.

In addition, according to the present invention, the transparent substance having a plurality of continuous half-spherical convexes on its first main surface is characterized by being prepared through a porous aluminum oxide layer forming process. The porous aluminum oxide layer forming process is known in a technical field different from this invention's technical field. However, there are no cases of using the porous aluminum oxide layer forming process to prepare the transparent substance having nano-sized convexes. Inventors of the present invention have found that the transparent substance having nano-sized convexes with a large size can be prepared at a low cost through the porous aluminum oxide layer forming process, and thus, the transparent substance having a non-planar structure can be applied to a flat panel display device such as an organic light-emitting device with a large size at a low cost.

Figure 7:
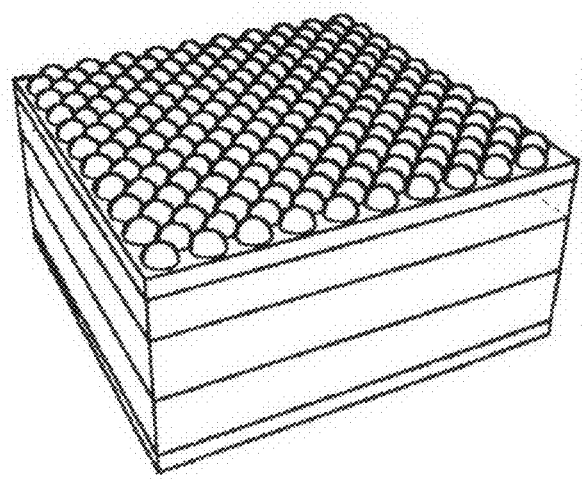
FIG. 7 shows a schematic diagram of an organic light-emitting device according to the present invention.

In the present invention, in order to achieve the above effect of the present invention, half-spherical convexes disposed on the substrate or electrode in the organic light-emitting device of the present invention preferably have a diameter of a range between a half wavelength and one wavelength of the visible ray, i.e., 200-800 nm. In addition, the half-spherical convexes are preferably uniformly distributed. In the present invention, the surface formed with continuous nano-sized convexes is illustrated in FIG. 7.

The porous aluminum oxide layer forming process has been disclosed in a document entitled A. P. Li et al. J. Appl. Phys., 84, 6023 (1998), etc. A simple explanation is provided below. An aluminum substrate having at least one aluminum surface is dipped in an appropriate acid solution, such as a sulfuric acid solution, a phosphoric acid solution, an oxalic acid solution or a chromic acid solution. Then, an appropriate oxidation voltage, for example 10 to 400 V is applied to the aluminum substrate so that an oxide layer, in which recesses having a diameter of about 25 to 1,000 nm, preferably 200 to 800 nm, and a depth of about a few hundreds of nm to few μm are uniformly distributed, can be formed at the aluminum substrate. The depth of the recesses may increase proportionally to the processing time. At this time, at an interface between the oxide layer and the aluminum substrate, recesses having a curvature in identical direction to curvature of the half-spherical recesses on the oxide layer are formed.

Figure 5:
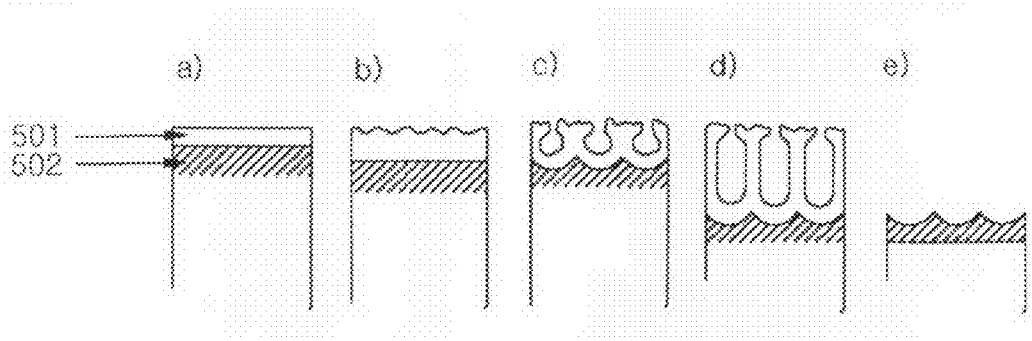
FIG. 5 shows a process for preparing an aluminum mold having continuous nano-sized half-spherical recesses (501: aluminum oxide layer, 502: aluminum substrate).

FIG. 5 shows a forming process for an aluminum oxide layer through the above method. In FIG. 5, steps a) to d) represent shape-variation of the oxide layer over time in the porous aluminum oxide layer forming process. At an initial stage, a thin and uniform oxide layer (501) is formed on an aluminum substrate (502) (see (a) in FIG. 5). After a period of time, as the volume of the oxide layer is expanded, a surface of the oxide layer is irregularly deformed (see, (b) in FIG. 5). Such an irregular surface of the oxide layer may cause an uneven current density. That is, the current density may increase at a recess section of the oxide layer and may decrease at a protrusion section of the oxide layer. Then, fine recesses are formed at the recess section having a high current density due to an operation of an electric field and an electrolyte of the acid solution. The diameter of the fine recesses does not further increase after a predetermined time lapses (see, (c) in FIG. 5). In addition, the depth of the recesses may rapidly increase in a vertical direction with respect to the surface formed with the recesses while constantly maintaining the number of the recesses (see (d) in FIG. 5). As the depth of the recesses increases, recesses having a curvature in identical direction to the curvature of the recesses on the aluminum oxide layer are formed at an interface of the aluminum oxide layer (501) and the aluminum substrate (502) (see (c) and (d) in FIG. 5).

After forming a porous oxide layer on the aluminum substrate by the process explained above, a substrate formed with a plurality of continuous half-spherical recesses as (e) in FIG. 5 can be prepared by removing the porous oxide layer from the aluminum substrate. The oxide layer can be removed through a chemical etching process, an electrochemical etching process or an electrical shock process, etc. However, the present invention does not limit the process for removing the oxide layer.

According to the chemical etching process, the oxide layer is etched by using an acid solution. The example of the acid solution includes a mixture of a phosphoric acid solution and a chromic acid solution. According to the electrochemical etching process, a substrate formed with the oxide layer is used as an electrode and the substrate is dipped in the acid solution so that the oxide layer is removed from the substrate through an electrochemical reaction. The example of the acid solution includes a mixture of ethanol and $HClO_4$. According to the electrical shock process, electric shock is applied to the substrate by electrochemically adjusting the voltage, thereby removing the oxide layer from the aluminum substrate.

In the process, if the aluminum substrate includes at least one aluminum surface, the remaining material of the aluminum substrate is not limited to specific materials. For instance, a substrate consisting of aluminum can be used in the present invention, and a substrate consisting of an aluminum layer laminated on another substrate such as a glass substrate also can be used.

Then, nano-sized half-spherical convexes, which are inverted structures of nano-sized half-spherical recesses, can be formed on the transparent substance by using the aluminum substrate formed with continuous nano-sized half-spherical recesses as a mold. For this purpose, the methods known for this technical field may be used and the present invention is not limited to specific methods.

The material for the transparent substance preferably includes something able to be used as a replica molding material that can remain and flatten the shape of nano-sized half-spherical recesses in the aluminum substrate. Most polymers can be used as the material for the transparent substance.

However, the transparent substance having nano-sized half-spherical convexes for being applied to an organic light-emitting device of the present invention needs to have good transmission at the visible range of light. Therefore, the material for the transparent substance more preferably is a polymer that has no less than 60% of transmittance for a visible ray after being formed nano-sized half-spherical convexes thereon. The material satisfying said condition includes PDMS (poly(dimethylsiloxane) [see, T. M. Odom et al. Langmuir, 18, 5314 (2002)] or PMMA (polymethylmethacrylate) [see, H. Tan et al. J. vac. Sci. Technol. B, 16, 3926 (1998)], but is not limited to them.

One method for forming continuous nano-sized half-spherical convexes on the transparent substance consisting of such material may be a nano-imprint technique.

A nano-imprint technique is a method that uses a substrate having a nano-sized structure as a mold for preparing a film having an inverted mold structure. That is, a film is formed on a substrate having a nano-sized structure by using a material that can remain and flatten the structure of the substrate, such as PDMS or PMMA. Such film can be formed by a method such as pouring or spin-coating such material in molten state on the mold substrate, etc. If bubbles are generated on the film, the bubbles can be removed by curing the film under a vacuum. Then, a film having an inverted structure of a nano-sized structure on the mold can be prepared by curing the film through heat or ultraviolet and then taking off the substrate used as the mold.

In the method, it is preferable that the bonding between the mold and transparent film having an inverted structure of the mold's structure is weakened, for transferring the nanometer-sized structure. In this regard, the mold substrate may be dipped in a solution comprising a material able to reduce a surface energy of the mold substrate, or formed with a release layer thereon by exposing the mold substrate to the vapor of a material able to reduce a surface energy of the mold substrate, and then washing the mold substrate. The material able to reduce the surface energy of the mold substrate includes tridecafluoro-1,1,2,2-tetrahydrooctyltrichlorosilane, etc. However, the present invention is not limited to such methods and may use methods known in the art in order to achieve the same effect as the one achieved by the release layer.

In the nano-imprint technique, said aluminum substrate having continuous nano-sized half-spherical recesses can be used as the mold substrate, but a polymer mold having continuous nano-sized half-spherical recesses prepared by repeating the nano-imprint technique more than 2 times by using the aluminum substrate as a mold also can be used. At this time, the material for the polymer mold includes hard polymer materials, for example, polyurethane, etc. In order to complement the hardness of the polymer mold and facilitate separation between the polymer mold and the transparent substance in the preparation of the transparent substance having continuous nano-sized half-spherical convexes, a scratch resistant thin layer consisting of polystyrene or polycarbonate, etc. or metal thin layer may be formed on the polymer mold. The aluminum or polymer mold can be used more than 10 times through a simple washing.

Another method for forming continuous nano-sized half-spherical convexes on the transparent substance may be a method that forms continuous nano-sized half-spherical convexes by appropriately pressing the transparent substance by the aluminum mold having continuous nano-sized half-spherical recesses while curing the transparent substance by ultraviolet or heat. In such method, the continuous nano-sized half-spherical convexes can be formed on the transparent substance by adhering the mold to a roller or forming continuous nano-sized half-spherical recesses on a roller, and then performing a roll process by such roller [see, H. Tan et al. J. Vac. Sci. Technol. B, 16, 3926 (1998)].

In the present invention, the transparent substance prepared as described above can be applied to devices that need to minimize the condition of a total internal reflection. Recently, such relief of a total internal reflection is required in a flat panel display device field, but the application of the transparent substance of this invention is not limited to it. In one embodiment of the present invention, the transparent substance according to the present invention can be applied to an organic light-emitting device.

Au organic light-emitting device having continuous nano-sized half-spherical convexes can be prepared by adhering the transparent substance of the present invention to a transparent substrate and/or a transparent electrode, and forming continuous nano-sized half-spherical convexes on the transparent substance by the method as described above before or after adhering the transparent substance to the substrate or the electrode. The process that adheres the transparent substance to the transparent substrate or transparent electrode and the process that forms continuous nano-sized half-spherical convexes on the transparent substance may be performed before or after preparing the organic light-emitting device.

In the present invention, the method adhering the transparent substance to the substrate or electrode is not limited to a specific method, and the present invention may use methods known in the art.

One example of the method adhering the transparent substance to the substrate or electrode of the device is a method comprising the steps of activating the surface of the substrate or electrode by oxygen plasma, etc., and then adhering the transparent substance to the substrate or electrode by heat or ultraviolet so as to remove an air layer between the transparent substance and the substrate or electrode.

Another example of the method adhering the transparent substance to the substrate or electrode of the device is a method that forms a self-assembled monolayer (SAM) on the substrate or electrode to improve adhesion between the transparent substance and the substrate or electrode. As an example, in order to improve adhesion between a glass substrate and a PDMS substance, the SAM can be formed on the glass substrate by dissolving 5-hexenyltrichlorosilane in a solvent such as toluene, and then dipping the glass substrate in the solution.

Another method adhering the transparent substance to the substrate or electrode is a method that forms a polymer film by a method comprising the step of pouring or spin-coating the material of the transparent substance in the molten state on the substrate or electrode.

In the present invention, when the transparent substance is adhered to a transparent substrate, a material having mechanical and thermal stability and low permeability for water and oxygen preferably may be used as a material for the transparent substrate. Preferable examples of the material include glass, quartz, polymers, and materials having a laminated structure of metal oxides having a good barrier property for water and oxygen. However, the present invention is not limited to them.

The organic light-emitting device of the present invention can be prepared by methods known in the art and can have a structure known in the art, except for having continuous nano-sized half-spherical convexes on the surface of the substrate and/or electrode of the device by the method as described above.

Figure 1:
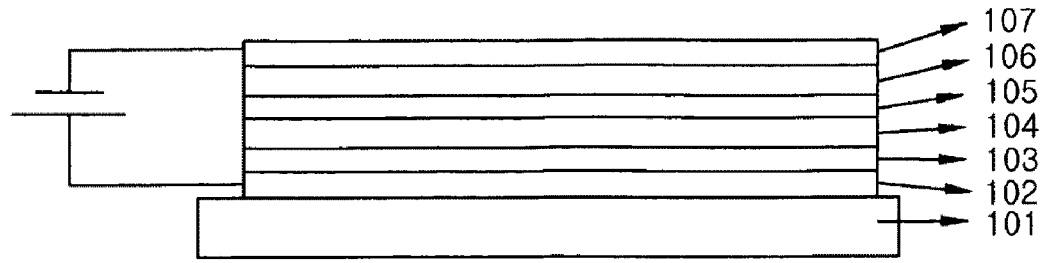
FIG. 1 shows an example of a conventional organic light-emitting device (101: glass substrate, 102: transparent anode, 103: hole injection layer, 104: hole transport layer, 105: light-emitting layer, 106: electron transport layer, 107: metal cathode).
Figure 2:
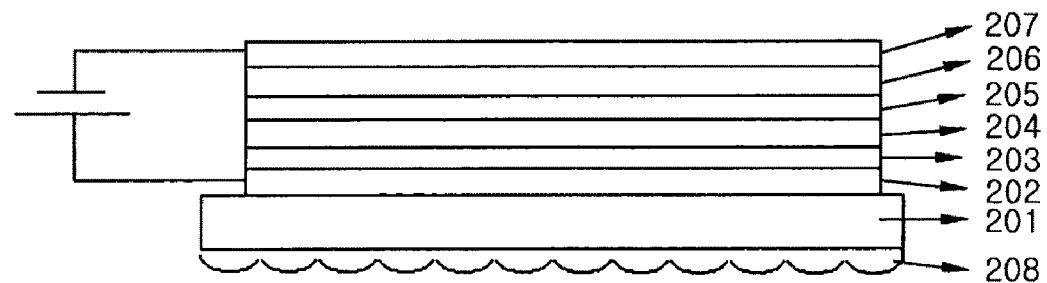
FIG. 2 shows an example of an organic light-emitting device according to the present invention (201: glass substrate, 202: transparent anode, 203: hole injection layer, 204: hole transport layer, 205: light-emitting layer, 206: electron transport layer, 207: metal cathode, 208: transparent substance having nano-sized convexes).
Figure 3:
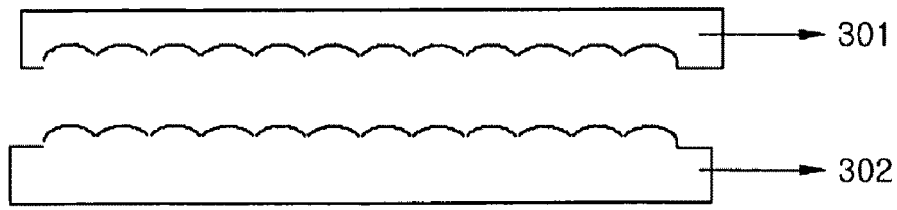
FIG. 3 shows a mold (301) formed with continuous nano-sized half-spherical recesses and a transparent substance (302) formed with continuous nano-sized half-spherical convexes.

According to one embodiment of the present invention, the organic light-emitting device may have a structure as shown in FIG. 2. The organic light-emitting device shown in FIG. 2, can be prepared by depositing an anode (202) on the transparent substrate (201) adhering the transparent substance (208) having continuous nano-sized half-spherical convexes, using a metal, a metal oxide having conductivity, or an alloy thereof then forming organic material layers comprising a hole injection layer (203), a hole transport layer (204), a light-emitting layer (205) and a electron transport layer (206), etc. thereon, and then depositing a material used for a cathode (207) thereon, by a physical vapor deposition (PVD) such as an E-beam evaporation or a sputtering, etc.

In addition to such method, an organic light-emitting device can be prepared by sequentially depositing a cathode material, an organic material layer, and an anode material on the substrate (see, WO 2003/012890). The organic material layer may have the form of a single layer structure or a multi-layer structure comprising a hole injection layer, a hole transport layer, a light-emitting layer and an electron transport layer, etc. The organic material layer may be formed in a smaller number of layers through a solvent process, such as a spin coating process, a screen-printing process or an ink jet process using various polymer materials, instead of a physical vapor deposition process.

The anode preferably may be prepared by using a material having a high work function in order to allow holes to be easily injected into the organic material layer. Particularly, the material for the anode includes metals, such as vanadium, chrome, copper, zinc gold, or an alloy thereof; metal oxides, such as a zinc oxide, an indium oxide, an indium tin oxide (ITO), or an indium zinc oxide (IZO); a mixture of a metal and an oxide, such as ZnO:Al or $SnO_2$:Sb; and conductive polymers, such as poly(3-methylthiophene), poly[3,4-(ethylene-1,2-dioxy)thiophene (PEDT), polypyrrole, and polyaniline, etc. However, the present invention does not limit the material for the anode. In order to emit the light through the anode in the organic light-emitting device, a material having a high transparent degree (>50%), particularly a metal oxide such as zinc oxide, indium oxide, indium tin oxide (ITO) and indium zinc oxide (IZO), or a thin metal layer, etc preferably may be used as the material for the anode. In addition, in order to emit the light through the cathode in the organic light-emitting device, a material having a high reflectance (>50%) preferably may be used as the material for the anode, and more preferably Ag, Al, Ni, Cr, Au or an alloy thereof, etc. may be used.

The cathode preferably may be prepared by using a material having a low work function in order to allow electrons to be easily injected into the organic material layer. Specifically, the material for the cathode includes metals, such as Mg, Ca, Na, K, Ti, In, Yt, Li, Gd, Al, Ag, Sn, Pb, or an alloy of the same; and multi-layer materials such as LiF/Al or $LiO_2$/Al. However, the present invention does not limit the material for the cathode. In order to emit the light through the cathode in the organic light-emitting device, a material having a high transparent degree (>50%) preferably may be used as the material for the cathode. Particularly, a material prepared by depositing a transparent conductive material such as indium tin oxide or indium zinc oxide on a transparent thin layer consisting of Al or a mixture of Mg and Ag is more preferred.

The hole injection layer is prepared by using a material capable of allowing holes to be injected from the anode at a low voltage condition. It is preferred that the material for the hole injection layer has an HOMO (highest occupied molecular orbital) between the work function of the anode material and the HOMO of a peripheral organic material layer. Specifically, the material for the hole injection layer includes metal porphyrine, oligothiophene, arylamine-based organic materials, hexanitrile hexaazatriphenylene, quinacridone-based organic materials, perylene-based organic materials, anthraquinone-based conductive polymer, polyaniline and polythiophene-based conductive polymer or conductive polymer such as a dopant. However, the present invention does not limit the material for the hole injection layer.

The hole transport layer is prepared by using a material capable of transporting holes from the anode or the hole injection layer to the light-emitting layer. It is preferred that the material for the hole transport layer has a high hole mobility. Specifically, the material for the hole transport layer includes arylamine-based organic materials, conductive polymers, and block copolymers including a conjugate section and a non-conjugate section, etc. However, the present invention does not limit the material for the hole transport layer.

The light-emitting layer is prepared by using a material capable of generating light of a visible ray range by combining holes with electrons transferred from the hole transport layer and the electron transport layer, respectively. It is preferred that the material for the light-emitting layer represents a superior quantum efficiency with respect to fluorescence or phosphorescence. Specifically, the material for the light-emitting layer includes 8-hydroxy-quinoline aluminum complex ($Alq_3$), carbazole-based compounds, dimerized styryl compounds, BAlq, 10-hydroxybenzo quinoline-metal compounds, compounds based on benzoxazole, benzthiazole, and benzimidazole, poly(p-phenylenevinylene)-based polymers, poly phenylene vinylene (PPV)-based polymers, spiro compounds, polyfluorene, rubrene, etc. However, the present invention does not limit the material for the light-emitting layer.

The electron transport layer is prepared by using a material capable of transporting electrons from the cathode to the light-emitting layer. It is preferred that the material for the electron transport layer has a high electron mobility. Specifically, the material for the electron transport layer includes 8-hydroxy-quinoline aluminum complex, complexes including $Alq_3$, organic radical compounds, and hydroxyflavone-metal complexes, etc. However, the present invention does not limit the material for the electron transport layer.

The organic light-emitting device according to the present invention may be a top emission type, a bottom emission type or a bilateral emission type, depending on used materials.

EXAMPLES

Example 1

Preparation of an Organic Light-Emitting Device

Glass substrate (corning 7059 glass) coated with a thin layer of ITO (indium tin oxide) having a thickness of 1,000 Å was washed ultrasonically in distilled water in which a detergent was dissolved. In the process, a detergent made from Fischer Co. and distilled water prepared by filtering water 2 times using a filter made from Millipore Co. were used. After ITO was washed for 30 minutes as mentioned above, it was subjected to ultrasonic washing 2 times for 10 minutes. After then, it was washed by isopropyl alcohol, acetone, and methanol solvent sequentially by ultrasonic wave, and then dried.

Hexanitrile hexaazatriphenylene (500 Å), 4,4'-bis[N-(1-naphthyl)-N-phenylamino]biphenyl (NPB) (400 Å)), $Alq_3$ (300 Å) and a compound represented as the following formula 1 were sequentially deposited on the ITO electrode by a thermal vacuum deposition, thereby forming a hole injection layer, a hole transport layer, a light-emitting layer and an electron transport layer, sequentially.

Formula 1

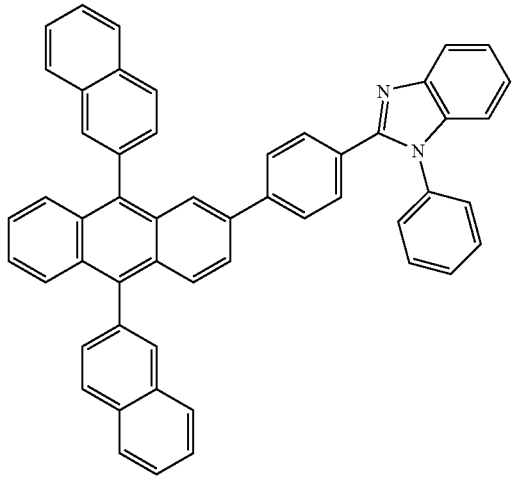

Then, lithium fluoride (LiF) having a thickness of 12 Å and aluminum having a thickness of 2000 Å were sequentially deposited on the electron transport layer so as to form a cathode, thereby forming an organic light-emitting device.

In the above process, the deposition rate of the organic materials was maintained at 0.4 to 0.7 Å/sec, the deposition rate of the LiF of the cathode was maintained at 0.3 Å/sec, the deposition rate of aluminum was maintained at 2 Å/sec, and the vacuum level was maintained at $2 \times 10^{-7}$ to $5 \times 10^{-8}$ torr during the deposition process.

Preparation of Aluminum Mold Having Continuous Nano-Sized Half-Spherical Recesses After dipping the aluminum substrate in a phosphoric acid solution, an oxidation voltage of 196 V was applied to the aluminum substrate, thereby forming an aluminum oxide layer formed with uniform recesses having a diameter of about 200-600 nm and a thickness of about a few μm on the aluminum substrate. Then, the aluminum oxide layer was removed from the aluminum substrate by performing a chemical etching process using a mixture of the phosphoric acid solution and a chromic acid solution, thereby obtaining an aluminum substrate having continuous nano-sized half-spherical recesses.

The aluminum substrate was subjected to an oxygen plasma treatment and then exposed to vapor of tridecafluoro-1,1,2,2-tetrahydrooctyltrichlorosilane. Then, the aluminum substrate was washed using toluene so as to obtain a release layer consisting of tridecafluoro-1,1,2,2-tetrahydrooctyl-trichlorosilane monolayer on the aluminum substrate.

Preparation of a Transparent Substance Having Continuous Nano-Sized Half-Spherical Convexes and Application thereof to the Organic Light-Emitting Device A mixture of a PDMS and a curing agent (Sylgard 184, Dow-Corning) in the ratio of 10:1 was poured on the aluminum substrate prepared as described above, and then the aluminum substrate was rotated at 3000 rpm so as to form a PDMS layer on the aluminum substrate. Then, the aluminum substrate was removed and the PDMS layer was obtained.

The underside of the glass substrate that did not contact the ITO electrode in the organic light-emitting device prepared as described above, was subjected to an oxygen plasma treatment for activation of glass surface. Then, the organic light-emitting device being treated as above was dipped in a toluene solution, in which 5-hexenyl trichlorosilane was dissolved, for 30 minutes so as to form a self-assembled monolayer consisting of 5-hexenyl trichlorosilane on the glass substrate.

Figure 6:
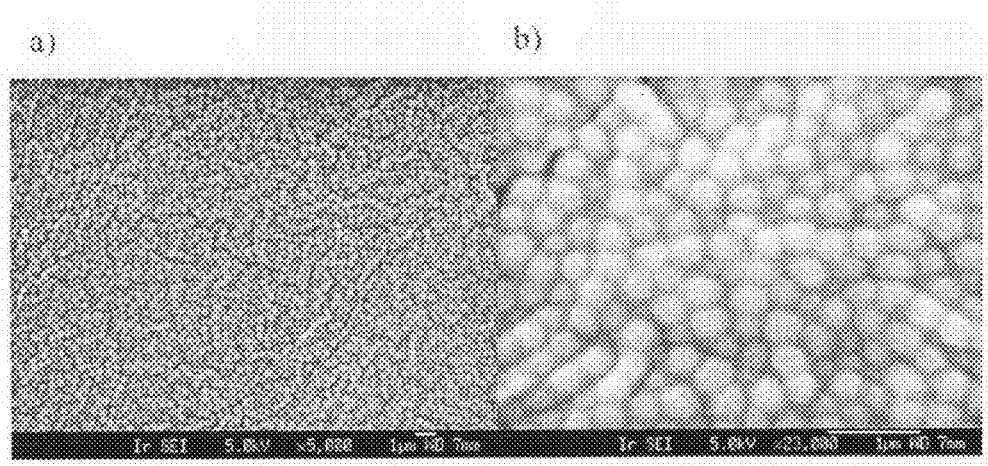
FIG. 6 is an electron micrograph showing the surface structure of a substance having continuous nano-sized half-spherical convexes prepared in Example 1 ((a)×5,000, (b)×23,000).

The surface of the glass substrate being treated with 5-hexenyl trichlorosilane in the organic light-emitting device was contacted with the PDMS layer. After curing the organic light-emitting device at 65° C. under vacuum, the organic light-emitting device having continuous nano-sized half-spherical convexes was obtained. FIG. 6 shows the structure of continuous nano-sized half-spherical convexes formed on the organic light-emitting device.

Results of Light-Emitting Experiments

When a forward electric field of 6 V was applied to the organic light-emitting device prepared as above, green emission corresponding to 3200 nit was observed from $Alq_3$.

Comparative Example 1

The organic light-emitting device was prepared using the same process as Example 1, except for not adhering the PDMS film having continuous nano-sized half-spherical on the transparent substrate of the organic light-emitting device.

When a forward electric field of 6 V was applied to the organic light-emitting device formed on the planar glass substrate having no nano-sized half-spherical convexes, green emission corresponding to 2300 nit was observed from $Alq_3$.

Comparative Example 2

The organic light-emitting device was prepared using the same process as Example 1, except for adhering a PDMS film having a planar structure on the transparent substrate of the organic light-emitting device.

When a forward electric field of 6 V was applied to the organic light-emitting device formed on the planar glass substrate having no nano-sized half-spherical convexes, green emission corresponding to 2100 nit was observed from $Alq_3$.

Through the results of Example 1 and Comparative Examples 1 and 2, it can be understood that the organic light-emitting device having continuous nano-sized convexes emit more light than the device having a planar surface, even if both of them were prepared by using identical organic materials.

INDUSTRIAL APPLICABILITY

The transparent substance having continuous nano-sized half-spherical convexes according to the present invention can be used for minimizing the condition of a total internal reflection in a technical field of a flat panel display such as an organic light-emitting device, etc. An organic light-emitting device having non-planar structure by being applied with the transparent substance having continuous nano-sized half-spherical convexes according to the present invention, can maximally emit light generated from the organic material layer out of the organic light-emitting device, compared with an organic light-emitting device of a planar structure. In addition, since continuous nano-sized half-spherical convexes according to the present invention can be prepared by using the aluminum substrate having continuous nano-sized half-spherical recesses prepared by a porous aluminum oxide layer forming process, as a mold, it can economically be applied to a large area. Therefore, the organic light-emitting device of the present invention can also be economically used in a large-sized application.

The invention claimed is:

1. A method for preparing an organic light-emitting device, comprising the steps of:
   a) preparing an organic light-emitting device by forming a first electrode, an organic material layer(s) and a second electrode on a substrate;
   b) adhering a transparent substance to the underside of the substrate that does not contact the first electrode, the upside of the second electrode that does not contact the organic material layer, or both of them in the organic light-emitting device;
   c) before or after the b) step, forming a plurality of continuous half-spherical convexes, having a diameter of 25-1,000 nm, on a first main surface of the transparent substance by a method comprising the steps of:
      (i) dipping an aluminum substrate having at least one aluminum surface in an acid solution, and applying an oxidation voltage of 10-400 V to the aluminum substrate so as to form an aluminum oxide layer on one surface of the aluminum substrate, in such a manner that a plurality of continuous recesses are formed on the aluminum oxide layer, and a plurality of continuous recesses having a curvature in identical direction to that of the recesses on the aluminum oxide layer are formed on an interface between the aluminum oxide layer and the aluminum substrate;
      (ii) removing the aluminum oxide layer from the aluminum substrate formed with the aluminum oxide layer thereon, thereby forming a plurality of continuous half spherical recesses having a diameter of 25-1,000 nm on one surface of the aluminum substrate; and
      (iii) forming a plurality of continuous half-spherical convexes, having a diameter of 25-1,000 nm, on the first main surface of a transparent substance by using the aluminum substrate formed with a plurality of continuous half spherical recesses as a mold.

2. A method for preparing an organic light-emitting device, comprising the steps of:
   a) adhering a transparent substance to a substrate;
   b) before or after the a) step, forming a plurality of continuous half-spherical convexes, having a diameter of 25-1,000 nm, on a first main surface of the transparent substance by a method comprising the steps of:
      (i) dipping an aluminum substrate having at least one aluminum surface in an acid solution, and applying an oxidation voltage of 10-400 V to the aluminum substrate so as to form an aluminum oxide layer on one surface of the aluminum substrate, in such a manner that a plurality of continuous recesses are formed on the aluminum oxide layer, and a plurality of continuous recesses having a curvature in identical direction to that of the recesses on the aluminum oxide layer are formed on an interface between the aluminum oxide layer and the aluminum substrate;
      (ii) removing the aluminum oxide layer from the aluminum substrate formed with the aluminum oxide layer thereon, thereby forming a plurality of continuous half spherical recesses having a diameter of 25-1,000 nm on one surface of the aluminum substrate; and forming a plurality of continuous half-spherical convexes, having a diameter of 25-1,000 nm, on the first main surface of a transparent substance by using the aluminum substrate formed with a plurality of continuous half-spherical recesses as a mold;
   c) preparing an organic light-emitting device by forming a first electrode, an organic material layer(s) and a second electrode on the upside of the substrate opposite to the side adhering the transparent substance having continuous half spherical con-vexes.

3. The method for preparing an organic light-emitting device according to claim 2, further comprising:
   d) adhering a transparent substance to the upside of the second electrode that does not contact the organic material layer in the organic light-emitting device; and
   e) before or after the d) step, forming a plurality of continuous half-spherical convexes, having a diameter of 25-1,000 nm, on the first main surface of the transparent substance on the upside of the second electrode, by a method comprising the steps of:
      (i) dipping an aluminum substrate having at least one aluminum surface in an acid solution, and applying an oxidation voltage of 10-400 V to the aluminum substrate so as to form an aluminum oxide layer on one surface of the aluminum substrate, in such a manner that a plurality of continuous recesses are formed on the aluminum oxide layer, and a plurality of continuous recesses having a curvature in identical direction to that of the recesses on the aluminum oxide layer are formed on an interface between the aluminum oxide layer and the aluminum substrate;
      (ii) removing the aluminum oxide layer from the aluminum substrate formed with the aluminum oxide layer thereon, thereby forming a plurality of continuous half-spherical recesses having a diameter of 25-1,000 nm, on one surface of the aluminum substrate; and
      (iii) forming a plurality of continuous half-spherical convexes, having a diameter of 25-1,000 nm, on the first main surface of a transparent substance by using the aluminum substrate formed with a plurality of continuous half-spherical recesses as a mold.

* * * * *